US009507228B2

United States Patent
Wang et al.

(10) Patent No.: US 9,507,228 B2
(45) Date of Patent: Nov. 29, 2016

(54) ARRAY SUBSTRATE AND DISPLAY DEVICE

(71) Applicant: SHENZHEN CHINA STAR OPTOELECTRONICS TECHNOLOGY CO., LTD., Shenzhen (CN)

(72) Inventors: Cong Wang, Shenzhen (CN); Ming Hung Shih, Shenzhen (CN); Peng Du, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,449

(22) PCT Filed: Jul. 4, 2014

(86) PCT No.: PCT/CN2014/081699
§ 371 (c)(1),
(2) Date: Jan. 22, 2015

(87) PCT Pub. No.: WO2015/188420
PCT Pub. Date: Dec. 17, 2015

(65) Prior Publication Data
US 2015/0362809 A1 Dec. 17, 2015

(30) Foreign Application Priority Data
Jun. 11, 2014 (CN) .......................... 2014 1 0258802

(51) Int. Cl.
G02F 1/1362 (2006.01)
H01L 27/12 (2006.01)

(52) U.S. Cl.
CPC ....... *G02F 1/136286* (2013.01); *H01L 27/124* (2013.01); *H01L 27/1255* (2013.01); *G02F 1/136209* (2013.01); *G02F 2201/40* (2013.01)

(58) Field of Classification Search
CPC ................................................. H01L 27/1255
See application file for complete search history.

(56) References Cited

U.S. PATENT DOCUMENTS

2004/0263750 A1* 12/2004 Chae ................. G02F 1/134363
349/141
2006/0203172 A1 9/2006 Baek et al.
(Continued)

FOREIGN PATENT DOCUMENTS

CN 1866117 A 11/2006
CN 101308294 A 11/2008
(Continued)

OTHER PUBLICATIONS

International Search Report (Form PCT/ISA/210) and the Written Opinion (Form PCT/ISA/237) issued on Mar. 13, 2015, by the State Intellectual Property Office of China acting as the International Searching Authority in aorresponding International Application No. PCT/CN2014/081699. (9 pages).

*Primary Examiner* — Lex Malsawma
(74) *Attorney, Agent, or Firm* — Buchanan Ingersoll & Rooney PC

(57) ABSTRACT

An array substrate belongs to the technical field of display technology and solves the technical problem of low aperture ratio of prior liquid crystal display device. The array substrate includes a plurality of sub pixel units arranged in an array and a plurality of signal lines, wherein one signal line of two adjacent signal lines is arranged in a first side of corresponding sub pixel units, and the other signal line is arranged in a second side of corresponding sub pixel units. The first side and the second side are one of opposite sides of the sub pixel units respectively. The array substrate can be used in liquid crystal television, liquid crystal display, mobile phone, tablet personal computer and other display devices.

8 Claims, 5 Drawing Sheets

(56) References Cited

U.S. PATENT DOCUMENTS

| | | | |
|---|---|---|---|
| 2007/0242009 A1* | 10/2007 | Su | G09G 3/3648 345/87 |
| 2008/0068516 A1 | 3/2008 | Mori et al. | |
| 2008/0284967 A1* | 11/2008 | Oh | G02F 1/134363 349/144 |
| 2010/0118221 A1 | 5/2010 | Kim et al. | |
| 2010/0321602 A1* | 12/2010 | Liu | G02F 1/13624 349/42 |

FOREIGN PATENT DOCUMENTS

| | | |
|---|---|---|
| CN | 101738800 A | 6/2010 |
| JP | 2006-091062 A | 4/2006 |

* cited by examiner

ARRAY SUBSTRATE AND DISPLAY DEVICE

CROSS REFERENCE TO RELATED APPLICATION

The present application claims benefit of Chinese patent application CN 201410258802.2, entitled "An Array Substrate and Display Device" and filed on Jun. 11, 2014, which is incorporated herein by reference.

FIELD OF THE INVENTION

The present disclosure relates to the technical field of display, particularly, to an array substrate and display device.

BACKGROUND OF THE INVENTION

With the development of display technology, liquid crystal display has become the most commonly used flat panel display device.

The liquid crystal display comprises an array substrate and a color film substrate. The array substrate is provided with a plurality of sub pixel units arranged in an array, and with gate lines and data lines arranged in a criss-cross pattern for separating each sub pixel unit. The array substrate is usually provided with common electrode lines parallel to the gate lines. The color film substrate is provided with a color film and a black matrix, the location of the color film layer corresponding to sub pixel units of the array substrate, and the location of the black matrix corresponding to the region of the array substrate outside the sub pixel units, i.e., the region of the gate lines, data lines and common electrode lines, to prevent light from leaking through the region of the array substrate outside the sub pixel units.

The area of black matrix in existing liquid crystal display device is relatively large so as to completely cover the gate lines, data lines and common electrode lines as well as other parts. Therefore, there exists the technical problem of low aperture ratio in the existing liquid crystal display device.

SUMMARY OF THE INVENTION

The purpose of the present disclosure is to provide an array substrate and display device so as to solve the technical problem of low aperture ratio in the existing liquid crystal display device.

The present disclosure provides an array substrate, comprising a plurality of sub pixel units arranged in an array and a plurality of signal lines, wherein one signal line of two adjacent signal lines is arranged in a first side of corresponding sub pixel units, and the other signal line is arranged in a second side of corresponding sub pixel units, said first side and said second side being one of opposite sides of the sub pixel units respectively.

In one embodiment, said signal lines are the gate lines corresponding to said sub pixel units in each row.

Further, said array substrate comprises a plurality of common electrode lines corresponding to said sub pixel units in each row.

Preferably, the gate line and the common electrode line corresponding to the sub pixel units in the same row are both arranged in the same side of said sub pixel units in the row.

Preferably, with respect to the gate line and the common electrode line corresponding to the sub pixel units in the same row, the common electrode line is arranged between the gate line and the sub pixel units in the said row.

Or, with respect to the gate line and the common electrode line corresponding to the sub pixel units in the same row, the gate line is arranged between the common electrode line and the sub pixel units in the said row.

Preferably, said gate lines and said common electrode lines are arranged in the same layer.

Further, each of said sub pixel units comprises a storage capacitor and a pixel electrode, wherein one end of said storage capacitor is connected with the gate line, and the other end of said storage capacitor is connected with said pixel electrode.

In another embodiment, said signal lines are the data lines corresponding to the sub pixel units in each column.

The present disclosure also provides a display device, comprising a color film substrate and an aforesaid array substrate, wherein said color film substrate is provided with a layer of a color film and a black matrix, the location of the layer of the color film corresponding to sub pixel units of said array substrate, and the location of said black matrix corresponding to the region of said array substrate outside the sub pixel units.

The beneficial effects achieved by the present disclosure are as follows: in the array substrate provided by the present disclosure, one signal line is arranged in a first side of corresponding sub pixel units, and the other signal line adjacent to the aforesaid signal line is arranged in a second side of corresponding sub pixel units, said first side and said second side being one of opposite sides of the sub pixel units respectively, so that two adjacent signal lines are arranged nearby. That is to say, the two adjacent signal lines are arranged between their corresponding sub pixel units in two rows (columns). To prevent light from leaking, the edge of the black matrix of the color film substrate exceeds the edge of the signal line. If the width of the exceeding part is S, the widths of the two signal lines are both A, and the space between the two signal lines is L, then the width of the black matrix covering the two signal lines would be 2A+2S+L.

In the prior art, each signal line is arranged alone. The width of the black matrix covering each signal line is A+2S, then the total width of the black matrix covering two signal lines is 2A+4S. Therefore, compared with the prior art, in the technical solution provided by the present disclosure, the width of the black matrix covering each two signal lines reduces by 2S−L. While the space L between the two adjacent signal lines can be set to a quite small value, so that the area of the black matrix can be reduced significantly, the aperture ratio of liquid crystal display device can be improved, and thus the technical problem of low aperture ratio in prior liquid crystal display device can be solved.

Other features and advantages of the present disclosure are about to be stated in the following description, and part of them will become obvious in the description or become understandable through the embodiment of the present disclosure. The objectives and other advantages of the present disclosure can be achieved and obtained through the structures specified in the description, claims and drawings.

BRIEF DESCRIPTION OF THE DRAWINGS

The drawings needed in the explanation of the embodiments are introduced below to illustrate the technical solutions of the embodiments of the present disclosure more clearly.

DETAILED DESCRIPTION OF THE EMBODIMENTS

The embodiments of the present disclosure will be explained in detail combining the drawings and specific examples, whereby the procedures can be fully understood and therefore implemented as to how the present disclosure solves the technical problems by using the technical means and achieves the technical effects. It should be noted that, as long as there are no conflicts, the technical features disclosed in each and every example of the present disclosure can be combined with one another in any way, and all technical solutions formed thereby are within the protection scope of the present disclosure.

The embodiments of the present disclosure provide an array substrate, comprising a plurality of sub pixel units arranged in an array, and a plurality of signal lines for separating the sub pixel units. One signal line of two adjacent signal lines is arranged in a first side of corresponding sub pixel units, and the other signal line is arranged in a second side of corresponding sub pixel units, said first side and said second side being one of opposite sides of the sub pixel units respectively.

In the array substrate provided in the embodiments of the present disclosure, one signal line is arranged in a first side of corresponding sub pixel units, and the other signal line adjacent to the aforesaid signal line is arranged in a second side of corresponding sub pixel units, said first side and said second side being one of opposite sides of the sub pixel units respectively, so that two adjacent signal lines can be arranged as closely as possible. That is to say, the two adjacent signal lines are arranged between their corresponding sub pixel units in two rows (columns). To prevent light from leaking, the edge of the black matrix of the color film substrate exceeds the edge of the signal line. If the width of the exceeding part is S, the widths of the two signal lines both are A, and the space between the two signal lines is L, then the width of the black matrix covering the two signal lines would be 2A+2S+L.

In the prior art, each signal line is arranged alone. The width of the black matrix covering each signal line is A+2S, then the width of the black matrix covering two signal lines is 2A+4S. Therefore, compared with the prior art, the width of the black matrix covering each two signal lines in the technical solution provided by the embodiments of the present disclosure reduces by 2S−L. While the space L between the two adjacent signal lines can be set to a quite small value, so that the area of the black matrix can be reduced significantly, the aperture ratio of liquid crystal display device can be improved, and thus the technical problem of low aperture ratio in the existing liquid crystal display device can be solved.

Embodiment 1

Figure 1:
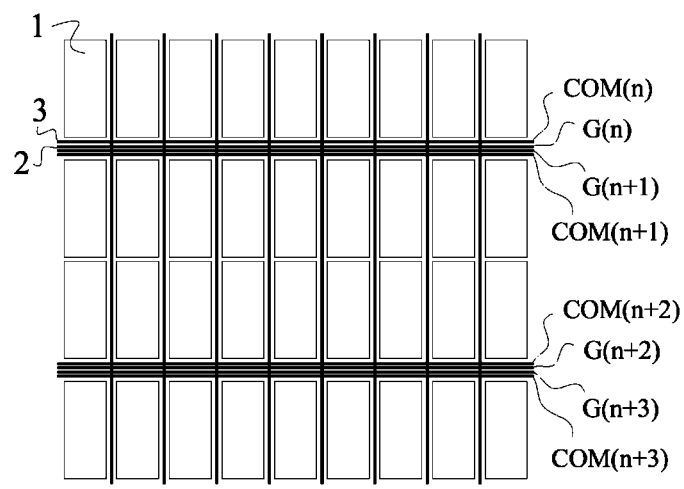
FIG. 1 is a schematic diagram of the array substrate provided in Embodiment 1 of the present disclosure.

The array substrate in embodiment 1 of the present disclosure comprises a plurality of sub pixel units arranged in an array and a plurality of signal lines. The signal lines of the present embodiment are gate lines 2 corresponding to sub pixel units 1 in each row, as shown in FIG. 1. With respect to two adjacent gate lines 2, for example G(n) and G(n+1), G(n) is arranged below (a first side) its corresponding sub pixel units 1, and G(n+1) is arranged above (a second side) its corresponding sub pixel units 1 (said first side and said second side being one of opposite sides of two rows of the sub pixel units respectively). For another example, in two adjacent gate lines G(n+2) and G(n+3), G(n+2) is arranged below its corresponding sub pixel units 1, and G(n+3) is arranged above its corresponding sub pixel units 1.

In addition, G(n+1) and G(n+2) can also be seen as two adjacent gate lines, in such case, G(n+2) is arranged below (the first side) its corresponding sub pixel units 1, and G(n+1) is arranged above (the second side) its corresponding sub pixel units 1 (the first side and the second side being one of opposite sides of two rows of the sub pixel units respectively).

The array substrate in embodiment 1 of the present disclosure further comprises a common electrode line 3 corresponding to sub pixel units 1 in each row, for providing a voltage to the common electrodes (not shown in FIG. 1) corresponding to each sub pixel unit 1. Since the gate lines 2 and common electrode lines 3 are arranged in the same layer, gate lines 2 and common electrode lines 3 can be formed simultaneously in one patterning process.

As a preferred solution, the gate line 2 and common electrode line 3 corresponding to the sub pixel units 1 in the same row are both arranged in the same side of the sub pixel units 1 in the row, so that the gate line 2 and the common electrode line 3 can both be covered by one strip of the black matrix, and the number of the strip of the black matrix is reduced. For example, as shown in FIG. 1, G(n) and COM(n) are both arranged below its corresponding sub pixel units 1, and G(n+1) and COM(n+1) are both arranged above its corresponding sub pixel units 1, so that G(n), COM(n), G(n+1), and COM(n+1) can all be covered by one strip of the black matrix.

In the embodiment, with respect to the gate line 2 and the common electrode line 3 corresponding to the sub pixel units 1 in the same row, the common electrode line 3 is arranged between the gate line 2 and the sub pixel units 1 in the said row. In this manner, the common electrode line 3 is nearer to the sub pixel units 1 than the gate line 2, so that the common electrode line 3 can provide voltage to common electrode conveniently. For example, as shown in FIG. 1, COM(n) is nearer to corresponding sub pixel units 1 than G(n), and COM(n+1) is nearer to corresponding sub pixel units 1 than G(n+1).

In the array substrate provided in embodiment 1 of the present disclosure, G(n) is arranged below its corresponding sub pixel units 1, and G(n+1), adjacent to G(n), is arranged above its corresponding sub pixel units 1. In this manner, two adjacent gate lines, i.e., G(n) and G(n+1) are arranged closely as much as possible. That is to say, G(n) and G(n+1) are both arranged between their corresponding sub pixel units 1 in two rows, and the common electrode lines COM(n) and COM(n+1) corresponding to the sub pixel units 1 in the said two rows are both arranged between their corresponding sub pixel units 1 in the said two rows.

Figure 2:
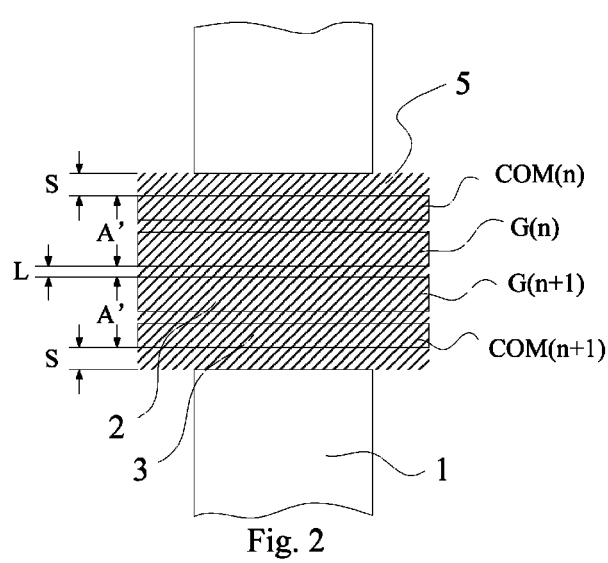
FIG. 2 is a partial schematic diagram of the gate lines and common electrode lines part of FIG. 1.

As shown in FIG. 2, to prevent the leaking of light, the edge of the black matrix 5 of the color film substrate is designed to exceed the edge of the gate line 2. If the width of the exceeding part is S, the total width of the gate line 2, and the common electrode line 3 including the space therebetween is A', and the space between G(n) and G(n+1) is L, then the width of the black matrix 5 covering G(n), COM(n), G(n+1), and COM(n+1) would be 2A'+2S+L.

Figure 3:
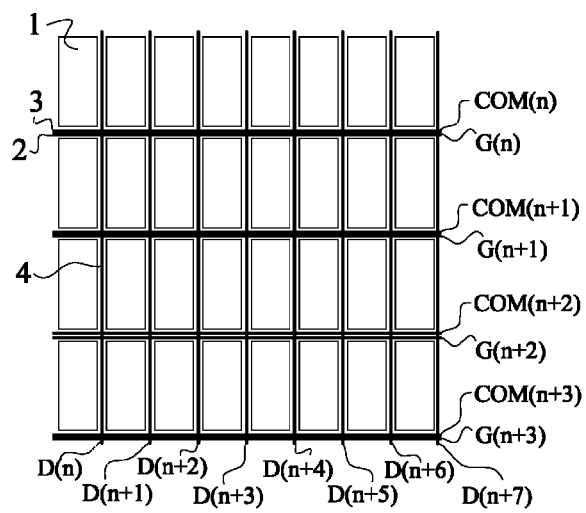
FIG. 3 is a schematic diagram of an array substrate in the prior art.
Figure 4:
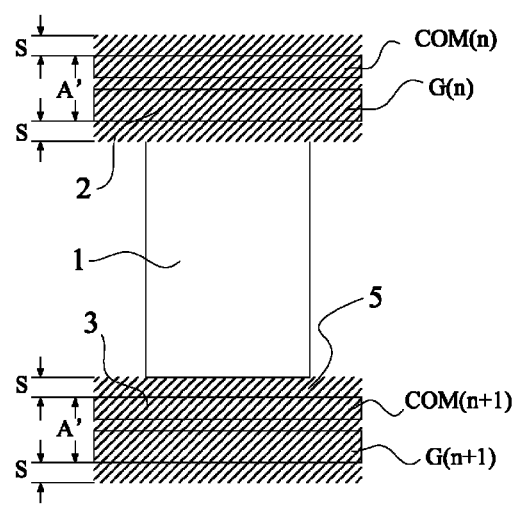
FIG. 4 is a partial schematic diagram of the gate lines and common electrode lines part of FIG. 3.

As shown in FIG. 3 and FIG. 4, in the prior art, each of gate lines 2 and common electrode lines 3 are arranged separately. The width of the black matrix 5 covering G(n) and COM(n) is A'+2S, and the width of the black matrix 5 covering G(n+1) and COM(n+1) is also A'+2S, then the total width of the black matrix 5 covering G(n), COM(n), G(n+1), and COM(n+1) is 2A'+4S. Therefore, compared with the prior art, in the technical solution provided by embodiment 1 of the present disclosure, the total width of the black matrix 5 covering two gate lines 2 and two common electrode lines 3 reduces by 2S−L. While the space L between the two adjacent gate lines 2 can be set to a quite small value. The smaller the space L is, the smaller the width of the black matrix 5 gets, so that the area of the black matrix 5 can be reduced significantly, the aperture ratio of liquid crystal display device can be improved, and thus the technical problem of low aperture ratio in prior liquid crystal display device can be solved.

In other embodiments, with respect to the gate line and the common electrode line corresponding to the sub pixel units in the same row, the gate line can be arranged between the common electrode line and the sub pixel units in the row. Furthermore, two adjacent common electrode lines can be merged into one common electrode line, and thus the width of the black matrix may be reduced further. The merged common electrode line corresponds to the sub pixel units in two rows, and supplies a voltage to the common electrode of the sub pixel units in the two rows.

Embodiment 2

Figure 5:
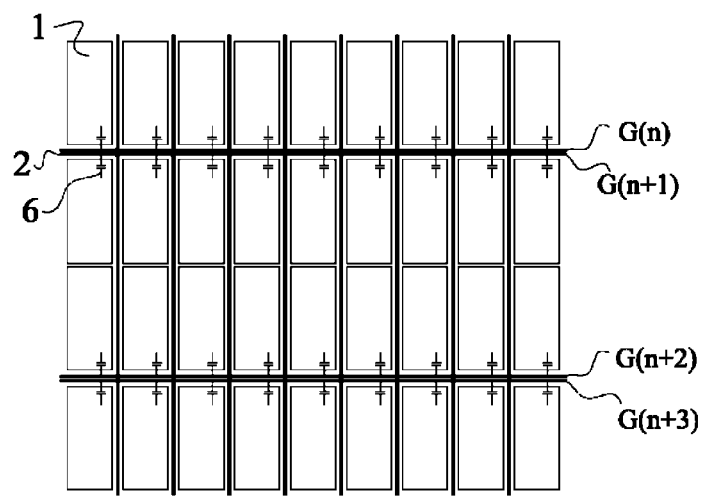
FIG. 5 is a schematic diagram of the array substrate provided in Embodiment 2 of the present disclosure.

The present embodiment is substantially same as embodiment 1. The array substrate comprises a plurality of sub pixel units 1 arranged in an array and a plurality of gate lines, as shown in FIG. 5. With respect to two adjacent gate lines 2, for example G(n) and G(n+1), G(n) is arranged below its corresponding sub pixel units 1, and G(n+1) is arranged above its corresponding sub pixel units 1. For another example, with respect to two adjacent gate lines G(n+2) and G(n+3), G(n+2) is arranged below its corresponding sub pixel units 1, and G(n+3) is arranged above its corresponding sub pixel units 1.

The differences of present embodiment from embodiment 1 lie in that: as shown in FIG. 5, each of said sub pixel units 1 comprises a storage capacitor 6 and a pixel electrode (not shown in FIG. 5), wherein one end of said storage capacitor 6 is connected with the gate line 2, and the other end of said storage capacitor 6 is connected with said pixel electrode. Particularly, part of pixel electrode can be covered by gate line 2, and the covered part forms the storage capacitor 6. In this case, the common electrode line can be omitted.

Figure 6:
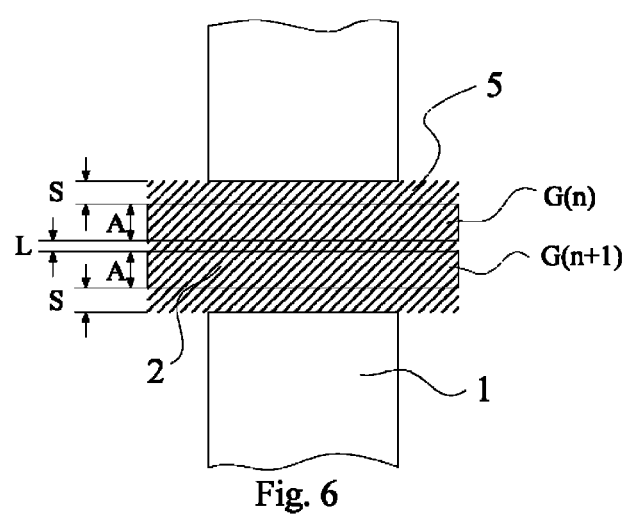
FIG. 6 is a partial schematic diagram of the gate lines part of FIG. 5.

As shown in FIG. 6, in the present embodiment, the width of the edge of the black matrix 5 exceeding that of the gate line 2 is S, the width of the gate line 2 is A, and the space between G(n) and G(n+1) is L, then the width of the black matrix 5 covering G(n) and G(n+1) is 2A+2S+L. Compared with the black matrix with the width of 2A'+2S+L in embodiment 1, the width A of the gate line in the present embodiment is less than A' in embodiment 1. Therefore, in the technical solution provided by the present embodiment, the width of the black matrix 5 can be further reduced, and the aperture ratio of liquid crystal display device can be improved accordingly.

Embodiment 3

Figure 7:
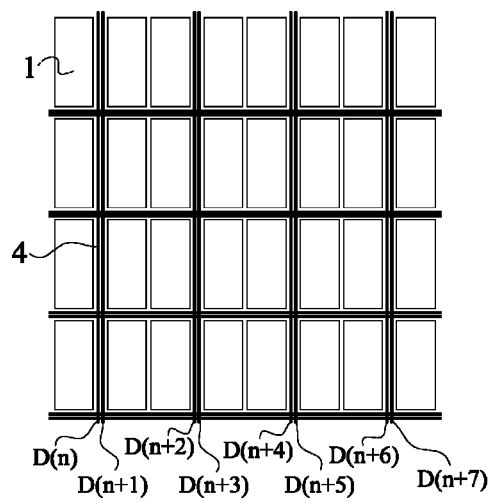
FIG. 7 is a schematic diagram of the array substrate provided in Embodiment 3 of the present disclosure.

The array substrate provided by embodiment 3 of the present disclosure comprises a plurality of sub pixel units 1 arranged in an array and a plurality of signal lines. The signal lines in the present embodiment are data lines 4 corresponding to the sub pixel units 1 in each column, as shown in FIG. 7. With respect to two adjacent data lines 4, for example D(n) and D(n+1), D(n) is arranged in the right side (a first side) of corresponding sub pixel units 1, and D(n+1) is arranged in the left side (a second side) of corresponding sub pixel units 1 (said first side and said second side being one of opposite sides of the sub pixel units respectively). For another example, in two adjacent data lines D(n+2) and D(n+3), D(n+2) is arranged in the right side of corresponding sub pixel units 1, and D(n+3) is arranged in the left side of corresponding sub pixel units 1.

In addition, D(n+1) and D(n+2) can be seen as two adjacent data lines, in such case, D(n+2) is arranged in the right side (the first side) of corresponding sub pixel units 1, and D(n+1) is arranged in the left side (the second side) of corresponding sub pixel units 1 (the first side and the second side being one of opposite sides of the sub pixel units respectively).

In the array substrate in embodiment 3 of the present disclosure, D(n) is arranged in the right side of corresponding sub pixel units 1, and D(n+1), adjacent to D(n), is arranged in the left side of corresponding sub pixel units 1. In this manner, two adjacent data lines, i.e., D(n) and D(n+1) are arranged near to each other. That is to say, D(n) and D(n+1) are both arranged between their corresponding sub pixel units 1 in two columns.

Figure 8:
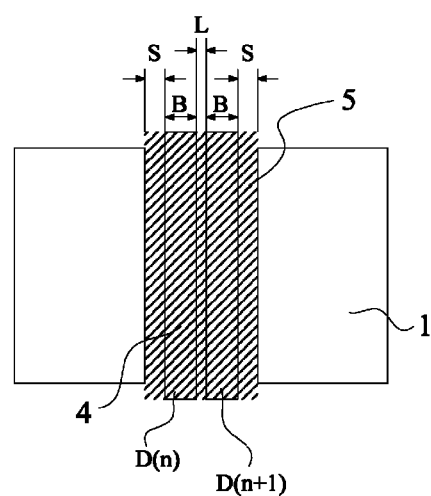
FIG. 8 is a partial schematic diagram of the data lines part of FIG. 7.

As shown in FIG. 8, to prevent light from leaking, the edge of the black matrix 5 of the color film substrate is designed to exceed that of the data line 4. If the width of the exceeding part is S, the width of the data line 4 is B, and the space between D(n) and D(n+1) is L, then the width of the black matrix covering D(n) and D(n+1) would be 2B+2S+L.

Figure 9:
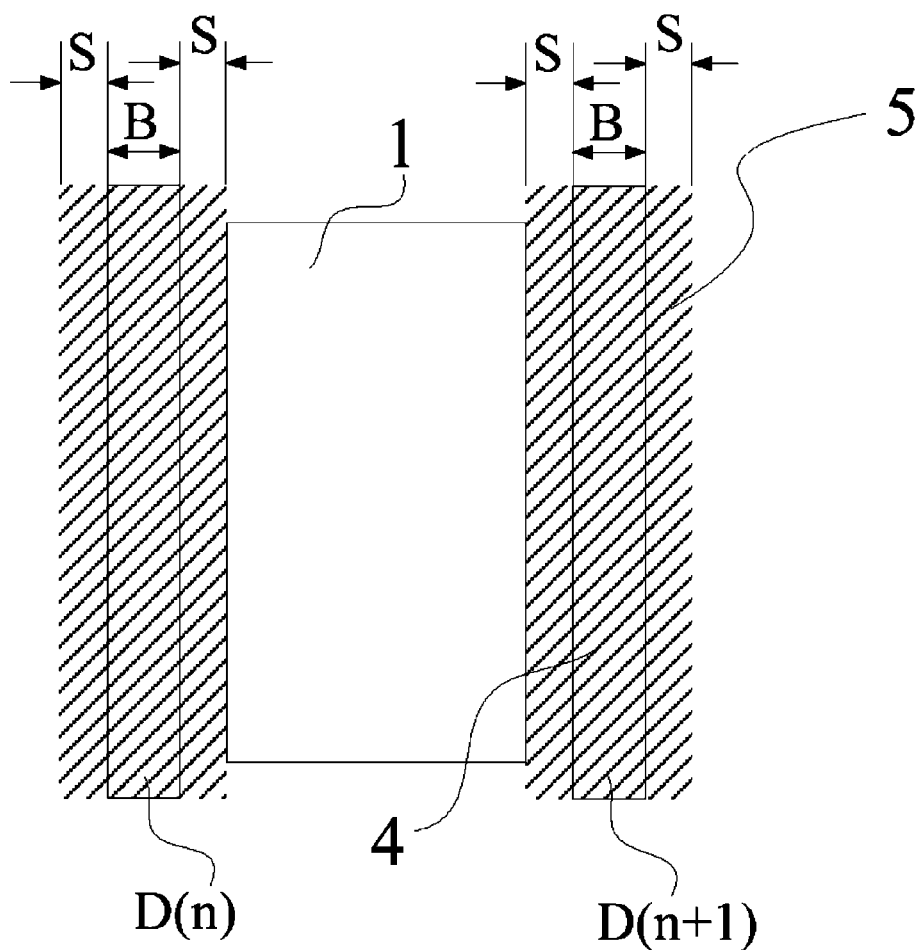
FIG. 9 is a partial schematic diagram of the data lines part of FIG. 3.

As shown in FIG. 3 and FIG. 9, in the prior art, each data line 4 is arranged alone. The width of the black matrix 5 covering D(n) is B+2S, and the width of the black matrix 5 covering D(n+1) is also B+2S, then the total width of the black matrix 5 covering D(n) and D(n+1) is 2B+4S. Therefore, compared with the prior art, in the technical solution provided in embodiment 3 of the present disclosure, the width of the black matrix 5 covering each two data lines 4 reduces by 2S−L. While the space L between the two adjacent data lines can be set to a quite small value. The smaller the space L is, the smaller the width of the black matrix 5 gets, so that the area of the black matrix 5 can be reduced significantly, the aperture ratio of liquid crystal display device can be improved, and thus the technical problem of low aperture ratio in prior liquid crystal display device can be solved.

It should be noted that embodiment 1, embodiment 2, and embodiment 3 can be combined together. That is to say, the gate lines in the array substrate can be designed in the following way: two adjacent gate lines are both arranged between their corresponding sub pixel units in two rows; similarly, the data lines in the array substrate can be designed in the following way: two adjacent data lines are both arranged between their corresponding sub pixel units in two columns. In this way, the widths of black matrices corresponding to gate lines and data lines are reduced, and thus the aperture ratio of liquid crystal display device is increased to some extent.

Embodiment 4

The present embodiment provides a display device, which can be used in liquid crystal television, liquid crystal display, mobile phone, tablet personal computer and other display devices. The display device comprises a color film substrate and an array substrate as described in aforesaid embodiment 1, embodiment 2 and embodiment 3. The color film substrate is provided with a color film layer and a black matrix, the location of said color film layer corresponding to sub pixel units of said array substrate, and the location of said black matrix corresponding to the regions of said array substrate outside the sub pixel units, including the regions of the gate lines, data lines, common electrode lines, thin film transistor, the wiring along the edge of the substrate and so on.

The display device provided by embodiment 4 of the present disclosure and the array substrate provided by the aforesaid embodiment 1, embodiment 2 and embodiment 3 share the same technical feature, solve the same technical problem and achieve the same technical effect.

The above embodiments are described only for better understanding, rather than restricting, the present disclosure. Any person skilled in the art can make amendments to the implementing forms or details without departing from the spirit and scope of the present disclosure. The scope of the present disclosure shall be determined by the scope as defined in the claims.

The invention claimed is:

1. An array substrate, comprising a plurality of sub pixel units arranged in an array and a plurality of signal lines,
wherein one signal line of two adjacent signal lines is arranged in a first side of corresponding sub pixel units, and the other signal line is arranged in a second side of corresponding sub pixel units, said first side and said second side being one of opposite sides of the sub pixel units respectively, wherein the two adjacent signal lines are gate lines, and two common lines are placed by the two sides of the two signal lines, wherein signal lines for two vertically adjacent rows of sub pixel units are intermediately arranged between the two vertically adjacent rows of sub pixel units.

2. The array substrate according to claim 1, wherein the gate line and the common electrode line corresponding to the sub pixel units in the same row are both arranged in the same side of said sub pixel units in the row.

3. The array substrate according to claim 1, wherein in the gate line and the common electrode line corresponding to the sub pixel units in the same row, the common electrode line is arranged between the gate line and the sub pixel units in the row.

4. The array substrate according to claim 1, wherein in the gate line and the common electrode line corresponding to the sub pixel units in the same row, the gate line is arranged between the common electrode line and the sub pixel units in the row.

5. The array substrate according to claim 1, wherein said gate lines and said common electrode lines are arranged in the same layer.

6. The array substrate according to claim 1, wherein each of said sub pixel units comprises a storage capacitor and a pixel electrode; and
wherein one end of said storage capacitor is connected with the gate line, and the other end of said storage capacitor is connected with said pixel electrode.

7. The array substrate according to claim 1, wherein said signal lines are the data lines corresponding to the sub pixel units in each column.

8. A display device, comprising a color film substrate and an array substrate,
said array substrate comprising a plurality of sub pixel units arranged in an array and a plurality of signal lines, wherein one signal line of two adjacent signal lines is arranged in a first side of corresponding sub pixel units, and the other signal line is arranged in a second side of corresponding sub pixel units, said first side and said second side being one of opposite sides of the sub pixel units respectively, wherein the two adjacent signal lines are gate lines, and two common lines are placed by the two sides of the two signal lines, wherein signal lines for two vertically adjacent rows of sub pixel units are intermediately arranged between the two vertically adjacent rows of sub pixel units,
wherein said color film substrate is provided with a layer of a color film and a black matrix, the location of the layer of the color film corresponding to sub pixel units of said array substrate, and the location of said black matrix corresponding to the region of said array substrate outside the sub pixel units.

* * * * *